United States Patent
Jo et al.

(10) Patent No.: US 11,997,857 B2
(45) Date of Patent: May 28, 2024

(54) HETEROJUNCTION OPTOELECTRONIC DEVICE AND METHOD OF MANUFACTURING THE SAME

(71) Applicant: EWHA UNIVERSITY—INDUSTRY COLLABORATION FOUNDATION, Seoul (KR)

(72) Inventors: William Jo, Seoul (KR); Hye Ri Jung, Pohang-si (KR)

(73) Assignee: EWHA UNIVERSITY—INDUSTRY COLLABORATION FO, Seoul (KR)

( * ) Notice: Subject to any disclaimer, the term of this patent is extended or adjusted under 35 U.S.C. 154(b) by 81 days.

(21) Appl. No.: 16/913,502

(22) Filed: Jun. 26, 2020

(65) Prior Publication Data

US 2021/0167308 A1 Jun. 3, 2021
US 2023/0165018 A9 May 25, 2023

(30) Foreign Application Priority Data

Nov. 29, 2019 (KR) .................. 10-2019-0156425
May 6, 2020 (KR) .................. 10-2020-0054080

(51) Int. Cl.
| | | |
|---|---|---|
| H10K 30/15 | (2023.01) | |
| H10K 30/80 | (2023.01) | |
| H10K 71/80 | (2023.01) | |
| H10K 77/10 | (2023.01) | |
| C07F 11/00 | (2006.01) | |
| H10K 102/00 | (2023.01) | |

(52) U.S. Cl.
CPC ......... *H10K 30/151* (2023.02); *H10K 30/152* (2023.02); *H10K 30/80* (2023.02); *H10K 71/80* (2023.02); *H10K 77/111* (2023.02); *C07F 11/00* (2013.01); *H10K 2102/00* (2023.02)

(58) Field of Classification Search
CPC ......... H01L 51/44; H10K 30/80; H10K 85/50
See application file for complete search history.

(56) References Cited

U.S. PATENT DOCUMENTS

2018/0366657 A1* 12/2018 Wakamiya .......... H01L 51/0007
2019/0181290 A1* 6/2019 Hsu ................. H01L 31/022425

FOREIGN PATENT DOCUMENTS

| CN | 108574050 A | 9/2018 | |
| CN | 109638091 A | 4/2019 | |
| JP | 2005-032917 A | 2/2005 | |
| KR | 10-1544317 B1 | 8/2015 | |
| KR | 10-2019-0009606 A | 1/2019 | |
| KR | 10-2019-0097662 A | 8/2019 | |
| WO | WO-2018047066 A1 * | 3/2018 | ......... H01L 51/0024 |

OTHER PUBLICATIONS

Li ("Charge Separation and Recombination in Two-Dimensional MoS2/WS2: Time-Domain ab Initio Modeling"), Chem. Mater. 2017, 29, 2466-2473 (Year: 2017).*

(Continued)

*Primary Examiner* — Angelo Trivisonno
(74) *Attorney, Agent, or Firm* — Greenberg Traurig, LLP

(57) ABSTRACT

The present disclosure relates to an optoelectronic device including a heterojunction of a halide perovskite single crystal and a two-dimensional semiconductor material layer and a method of manufacturing the same.

11 Claims, 16 Drawing Sheets

(56) References Cited

OTHER PUBLICATIONS

Singh ("Perovskite solar cells with an MoS2 electron transport layer"), J. Mater. Chem. A, 2019, 7, 7151-7158. (Year: 2019).*
Wang ("Electronics and optoelectronics of two-dimensional transition metal dichalcogenides"), Nature Nanotechnology vol. 7, pp. 699-712 (2012) (Year: 2012).*
Hye Ri Jung et al., "Transfer of Transition-metal Dichalcogenide onto Organolead Perovskite for Efficient Heterojunction", European Materials Research Society 2019 Spring, May 30, 2019, 23 pages.
Hye Ri Jung et al., "Effective Charge Transport in Perovskite/ Transition-metal Dichalcogenide Heterostructure", 2019 Korean Physical Society Fall Meeting, Oct. 25, 2019, 19 pages.
Hye Ri Jung et al., "Preparation of Perovskite Heterostructure for Advanced Interface with Exfoliated MoS2 and WS2", Materials Research Society, Nov. 12, 2019, 3 pages.

* cited by examiner

HETEROJUNCTION OPTOELECTRONIC DEVICE AND METHOD OF MANUFACTURING THE SAME

CROSS-REFERENCE TO RELATED APPLICATION

This application claims the benefit under 35 USC 119(a) of Korean Patent Applications No. 10-2019-0156425 filed on Nov. 29, 2019 in the Korean Intellectual Property Office, the entire disclosures of which are incorporated herein by reference for all purposes.

TECHNICAL FIELD

The present disclosure relates to an optoelectronic device including a heterojunction of a halide perovskite single crystal and a two-dimensional (2D) semiconductor material layer and a method of manufacturing the same.

BACKGROUND

A crystalline silicon solar cell based on Si diode semiconductor is currently the most widely used technology for directly converting solar energy into electricity. However, inorganic, organic and hybrid organic-inorganic thin film solar cells with advantages of less material consumption, cheap price and various kinds has been expected to be greatly boosted in the future. In a broad sense, the term "organic solar cell" uses an organic material as a main material of a photoactive layer and also uses a hybrid organic-inorganic material such as an inorganic oxide, an organic polymer/low molecular material or an organic metal. Thus, the term "organic solar cell" may include currently existing "organic thin film solar cells" an "solid-type dye-sensitized solar cells" that do not use a liquid electrolyte among dye-sensitized solar cells.

The "organic thin film solar cells" can be used to fabricate flexible devices that can be easily bent to a thickness of less than several hundred nanometers with colors, compared to inorganic thin films. Also, the "organic thin film solar cells" require relatively low-cost photoactive layer materials and adopt low-cost wet printing/coating processes. Therefore, in recent years, the "organic thin film solar cells" have been actively researched and developed [E-Chem Magazine, 1, 30 (2010)]. In general, an organic photoactive layer is formed of a pair of two materials having different electron affinities. Typically, a material having a lower electron affinity (electron donor) absorbs light to form excitons, and the excitons move to the interface between the electron donor and a material having a higher electron affinity (electron acceptor) and supply electrons to the electron acceptor, and, thus, the excitons are separated into holes and electrons. In this case, the distance traveled by the excitons may vary depending on the material and is typically about 10 nm. Therefore, the distance between the light absorption position and the interface between the two materials having different electron affinities needs to be less than 10 nm in order to obtain effectively separated electrons and holes.

Accordingly, making and maintaining nanostructures with well-controlled phase separation of the two materials at nm level is becoming a key technology for making the present organic thin film solar cell high performance. Therefore, a bi-layer structure solar cell formed by stacking an electron donor layer and an electron acceptor layer to a very small thickness at nm level and a so-called bulk heterojunction solar cell formed by mixing two materials to about 10 nm and coating/printing the two material as a single phase are the main device structures. The former is manufactured using a vacuum deposition process similar to the p-n or p-i-n multi-layered structure of a general inorganic thin film solar cell, whereas the latter can easily manufacture a photoactive layer using an inexpensive solution process. Therefore, in recent years, organic thin film solar cells have been manufactured using the latter structure and method.

However, when a bulk heterojunction solar cell is manufactured, perovskite (for example, thin film-type perovskite) is used instead of single crystals, which results in a decrease in adhesion to a semiconductor material. Also, a semiconductor material layer is transferred onto the perovskite using a thermal release tape, and, thus, it is impossible to transfer a thin 2D semiconductor material layer.

SUMMARY

The present disclosure provides an optoelectronic device including a heterojunction of a halide perovskite single crystal and a 2D semiconductor material layer, a solar cell including the same, and a method of manufacturing the same.

However, problems to be solved by the present disclosure are not limited to the above-described problems. Although not described herein, other problems to be solved by the present disclosure can be clearly understood by a person with ordinary skill in the art from the following description.

According to a first aspect of the present disclosure, there is provided an optoelectronic device including a heterojunction of a halide perovskite single crystal and a 2D semiconductor material layer.

According to a second aspect of the present disclosure, there is provided a method of manufacturing an optoelectronic device, including positioning a 2D semiconductor material layer on a flexible polymer film, adjusting the positions of the 2D semiconductor material layer and a halide perovskite single crystal by moving the flexible polymer film, and removing the flexible polymer film and bonding the 2D semiconductor material layer to the halide perovskite single crystal.

According to embodiments of the present disclosure, an optoelectronic device is a heterojunction of a halide-based perovskite single crystal and a 2D semiconductor material layer. Due to high carrier mobility in the 2D semiconductor material layer, a carrier in the perovskite single crystal can induce effective hole-electron separation, which may result in an improvement of charge transport capability.

According to embodiments of the present disclosure, the optoelectronic device is manufactured by bonding the 2D semiconductor material layer to the halide perovskite single crystal through low-temperature dry transfer printing. Therefore, it is possible to suppress damage to the surface of the halide perovskite single crystal. Also, it is possible to transfer a semiconductor material having a thin 2D structure to the halide perovskite single crystal. Accordingly, it is possible to increase the adhesion between the perovskite single crystal and the 2D semiconductor material layer.

According to embodiments of the present disclosure, in the optoelectronic device, even if the thin 2D semiconductor material layer is composed of twenty (20) layers of about 14 nm, it is not much different in work function than the perovskite single crystal. Thus, charges can be easily moved, which may result in an improvement of charge transport capability. Also, as the thickness of the 2D semiconductor material layer is decreased, current transport characteristics can be greatly improved.

According to embodiments of the present disclosure, in the optoelectronic device, the 2D semiconductor material layer is formed thin and bonded to the halide perovskite single crystal. Thus, it is possible to reduce the scale of the device. A material of the halide perovskite single crystal and a material of the 2D semiconductor material layer can be selected depending on purpose, and, thus, the energy level can be adjusted. Therefore, it is easy to design a device as desired.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
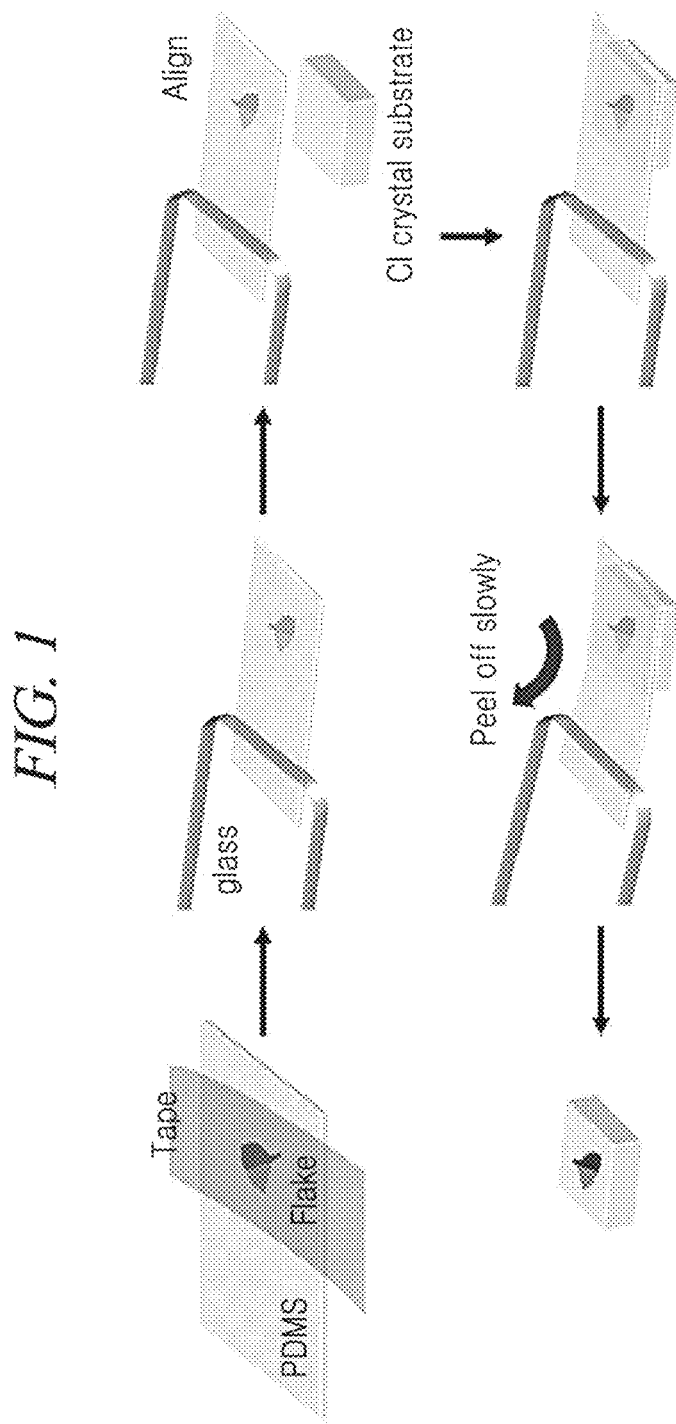
FIG. 1 schematically illustrates a manufacturing process of an optoelectronic device including a heterojunction of a halide perovskite single crystal and a 2D semiconductor material layer by performing low-temperature dry transfer printing and mechanical exfoliation in accordance with an embodiment of the present disclosure.

Throughout this document, the term "connected to" may be used to designate a connection or coupling of one element to another element and includes both an element being "directly connected to" another element and an element being "electronically connected to" another element via another element.

Through the whole document, the term "on" that is used to designate a position of one element with respect to another element includes both a case that the one element is adjacent to the other element and a case that any other element exists between these two elements.

Through the whole document, the term "comprises or includes" and/or "comprising or including" used in the document means that one or more other components, steps, operation and/or existence or addition of elements are not excluded in addition to the described components, steps, operation and/or elements unless context dictates otherwise.

Through the whole document, the term "about or approximately" or "substantially" is intended to have meanings close to numerical values or ranges specified with an allowable error and intended to prevent accurate or absolute numerical values disclosed for understanding of the present disclosure from being illegally or unfairly used by any unconscionable third party.

Through the whole document, the term "step of" does not mean "step for".

Through the whole document, the term "combination(s) of" included in Markush type description means mixture or combination of one or more components, steps, operations and/or elements selected from a group consisting of components, steps, operation and/or elements described in Markush type and thereby means that the disclosure includes one or more components, steps, operations and/or elements selected from the Markush group.

Through the whole document, a phrase in the form "A and/or B" means "A or B, or A and B".

Hereinafter, embodiments and examples of the present disclosure will be described in detail with reference to the accompanying drawings. However, the present disclosure may not be limited to the following embodiments, examples, and drawings.

According to a first aspect of the present disclosure, there is provided an optoelectronic device including a heterojunction of a halide perovskite single crystal and a 2D semiconductor material layer.

According to embodiments of the present disclosure, an optoelectronic device is a heterojunction of a halide-based perovskite single crystal and a 2D semiconductor material layer. Due to high carrier mobility in the 2D semiconductor material layer, a carrier in the perovskite single crystal can induce effective hole-electron separation, which may result in an improvement of charge transport capability.

In an embodiment of the present disclosure, the halide perovskite single crystal may be grown into single crystals on a substrate or may be grown alone without a substrate. Also, a perovskite thin-film material which is not formed into single crystals has stability, whereas perovskite grown into single crystals has high stability and shows improved charge transport characteristics.

Figure 2:
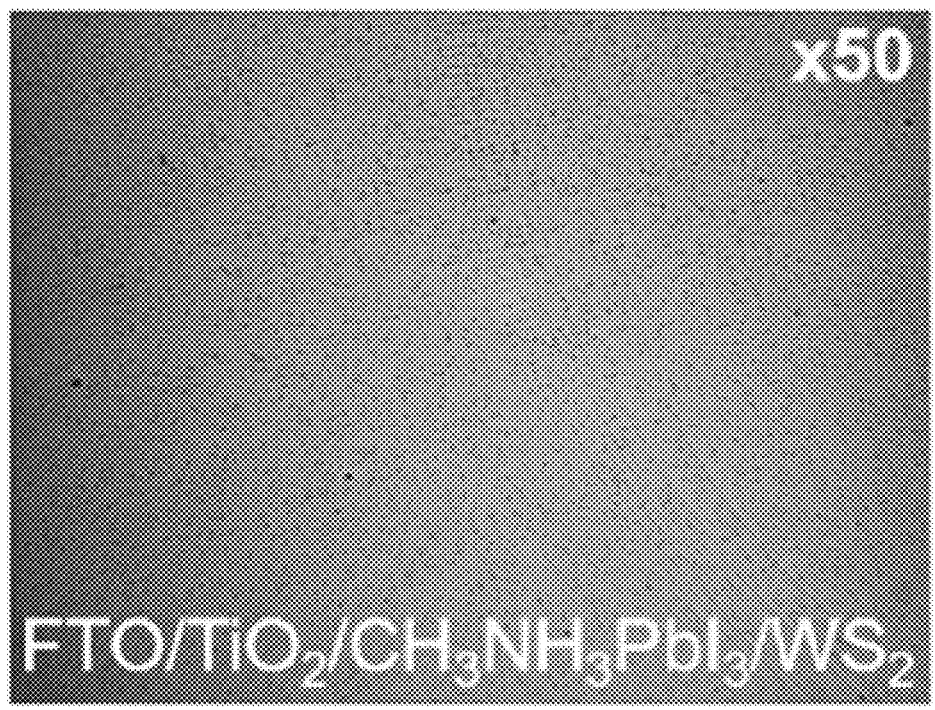
FIG. 2 is a photograph showing a 2D semiconductor material layer transferred onto thin film-type halide perovskite using a PDMS film in accordance with a comparative example of the present disclosure.
Figure 3:
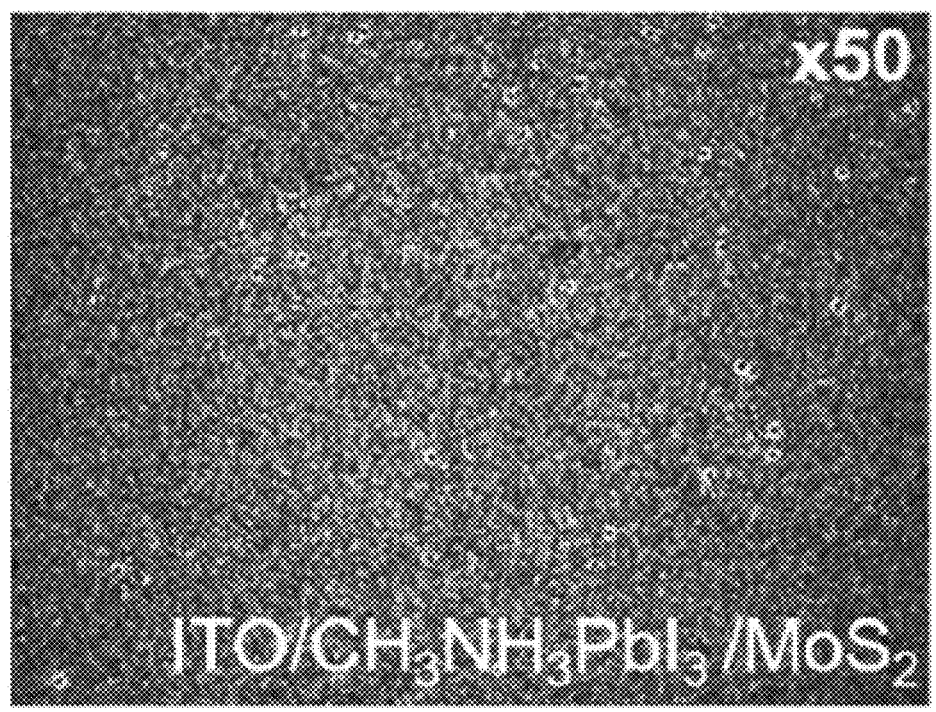
FIG. 3 is a photograph showing a 2D semiconductor material layer transferred onto thin film-type halide perovskite using a thermal release tape in accordance with a comparative example of the present disclosure.
Figure 4:
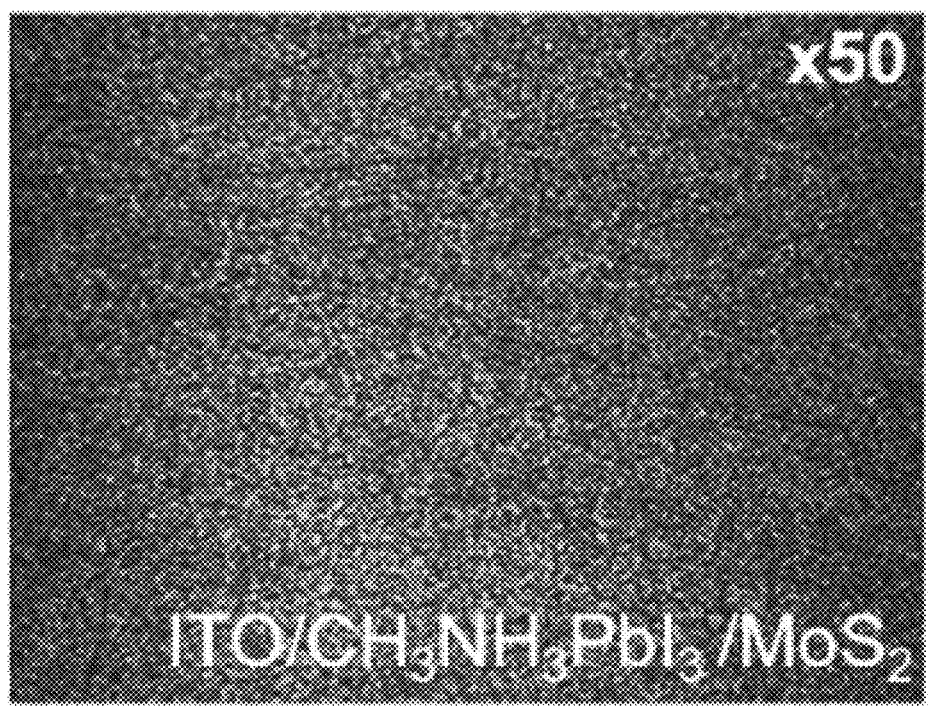
FIG. 4 is a photograph showing a 2D semiconductor material layer transferred onto thin film-type halide perovskite through direct exfoliation using a blue tape in accordance with a comparative example of the present disclosure.

In an embodiment of the present disclosure, the halide perovskite single crystal contains halide-based perovskite and may contain hybrid organic-inorganic perovskite. According to the conventional technology, thin film-type perovskite is used to provide an optoelectronic device. However, if perovskite is formed into a thin film, clusters of nanocrystals are formed during surface crystallization, which results in an increase in surface roughness. In this case, if a 2D semiconductor material layer is transferred onto the perovskite thin film, adhesion between the two materials may decrease due to the increased surface roughness (FIG. 2 to FIG. 4). However, the halide perovskite single crystal according to an embodiment of the present disclosure is grown on a single mother crystal and has a low surface roughness. Thus, a 2D semiconductor material layer can be easily transferred thereon regardless of transfer using a PDMS film, transfer using a thermal release tape and direct exfoliation.

In an embodiment of the present disclosure, one of two or more organic-metal halide compounds forming the hybrid organic-inorganic perovskite may be represented by the following Chemical Formula 1, and another one of the organic-metal halide compounds may be represented by the following Chemical Formula 2. Also, another one of the organic-metal halide compounds may be represented by the following Chemical Formula 3, but may not be limited thereto.

$$ABX_3 \quad \text{[Chemical Formula 1]}$$

In the above Chemical Formula 1, A is $CH_3NH_3^+$, $NH_2CHNH_2^+$ or $Cs^+$, B is a divalent metal ion such as $Cu^{2+}$, $Ni^{2+}$, $Co^{2+}$, $Fe^{2+}$, $Mn^{2+}$, $Cr^{2+}$, $Pd^{2+}$, $Ge^{2+}$, $Sn^{2+}$, $Pb^{2+}$, $Ee^{2+}$ or $Yb^{2+}$, and X is $Cl^-$, $Br^-$ or 

$$A'B'(X_{1(1-m)}X_{2(m)})_3 \quad \text{[Chemical Formula 2]}$$

In the above Chemical Formula 2, A' is $CH_3NH_3^+$, $NH_2CHNH_2^+$ or $Cs^+$, B' is a divalent metal on such as $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, $Eu^{2+}$ or $Yb^{2+}$, $X_1$ is $Br^-$ or $I^-$, $X_2$ is $F^-$, $Cl^-$, $Br^-$ or $I^-$, and m is a real number of from 0.0001 to 1.

$$A''B''(X_{1(1-m)}X_{2(m)})_{3-y}X_{3y} \quad \text{[Chemical Formula 3]}$$

In the above Chemical Formula 3, A" is $CH_3NH_3^+$, $NH_2CHNH_2^+$ or $Cs^+$, B" is a divalent metal ion such as $Cu^{2+}$, $Ni^{2+}$, $Co^{2+}$, $Fe^{2+}$, $Mn^{2+}$, $Cr^{2+}$, $Pd^{2+}$, $Cd^{2+}$, $Sn^{2+}$, $Pb^{2+}$, $Eu^{2+}$ or $Yb^{2+}$, $X_1$ is $F^-$, $Cl^-$, $Br^-$ or $I^-$, $X_2$ is $F^-$, $Cl^-$, $Br^-$ or $I^-$, $X_3$ is $F^-$, $Cl^-$, $Br^-$ or $I^-$ m is a real number of from 0.0001 to 1, and y is a real number of from 0.0001 to 1.

In an embodiment of the present disclosure, the hybrid organic-inorganic perovskite may include one or more members selected from $CH_3NH_3PbCl_3$, $CH_3NH_3PbBr_3$, $CH_3NH_3PbI_3$, $HC(NH_2)_2PbCl_3$, $HC(NH_2)_2PbBr_3$, $HC(NH_2)_2PbI_3$, $CsPbCl_3$, $CsPbBr_3$, $CsPbI_3$, $CH_3NH_3SnCl_3$ and $CH_3NH_3BaCl_3$.

In an embodiment of the present disclosure, the 2D semiconductor material may include $MoS_2$, $MoSe_2$, $WSe_2$, $ReS_2$, $ReSe_2$, $MoTe_2$, $WS_2$ or $WTe_2$, but may not be limited thereto.

In an embodiment of the present disclosure, the 2D semiconductor material layer may have a thickness of 14 nm or less. Specifically, the 2D semiconductor material layer may have a thickness of about 14 nm or less, about 12 nm or less, about 10 nm or less, about 8 nm or less, about 6 nm or less, about 4 nm or less, about 2 nm or less, from about 9 nm to about 15 nm, from about 9 nm to about 10 nm, from about 3 nm to about 15 nm, from about 3 nm to about 10 nm, from about 3 nm to about 5 nm, from about 5 nm to about 15 nm or from about 5 nm to about 10 nm. The 2D semiconductor material layer may include a multi-layer 2D semiconductor, and the number of layers of the 2D semiconductor may be about 20 layers or less, about 16 layers or less, about 12 layers or less, about 8 layers or less, about 4 layers or less, from about 4 layers to about 20 layers, from about 4 layers to about 14 layers, from about 4 layers to about 10 layers, from about 4 layers to about 8 layers, from about 8 layers to about 20 layers, from about 8 layers to about 14 layers, from about 10 layers to about 20 layers, from about 12 layers to about 20 layers or from about 12 layers to about 14 layers. The optoelectronic device including the hetero unction of the halide perovskite single crystal and the 2D semiconductor material layer is improved in electrical transport characteristics, compared to an optoelectronic device not ncluding the 2D semiconductor material layer.

According to embodiments of the present disclosure, in the optoelectronic device, even if the thin 2D semiconductor material layer is composed of twenty (20) layers of about 14 nm, it is not much different in work function than the perovskite single crystal. Thus, charges can be easily moved, which may result in an improvement of charge transport capability. Also, as the thickness of the 2D semiconductor material layer is decreased, current transport characteristics can be greatly improved. However, if the 2D semiconductor material layer is too thin (for example, a single layer), the stability and light absorption characteristics of the optoelectronic device may be degraded. Therefore, it is important to appropriately select the thickness of the 2D semiconductor material layer.

In an embodiment of the present disclosure, the halide perovskite single crystal may have a thickness of from about 1 nm to about 5000 nm. Specifically, the halide perovskite single crystal may have a thickness of from about 1 nm to about 5000 nm, from about 1 nm to about 4000 nm, from about 1 nm to about 3000 nm, from about 1 nm to about 2000 nm, from about 1 nm to about 1000 nm, from about 1 nm to about 500 nm, from about 1 nm to about 100 nm, from about 1 nm to about 50 nm, from about 1 nm to about 40 nm, from about 1 nm to about 30 nm, from about 1 nm to about 20 nm, from about 5 nm to about 5000 nm, from about 5 nm to about 4000 nm, from about 5 nm to about 3000 nm, from about 5 nm to about 2000 nm, from about 5 nm to about 1000 nm, from about 5 nm to about 500 nm, from about 5 nm to about 100 nm, from about 5 nm to about 50 nm, from about 5 nm to about 40 nm, from about 5 nm to about 30 nm, from about 5 nm to about 20 nm, from about 50 nm to about 5000 nm, from about 50 nm to about 4000 nm, from about 50 nm to about 3000 nm, from about 50 nm to about 2000 nm, from about 50 nm to about 1000 nm, from about 50 nm to about 500 nm, from about 50 nm to about 100 nm, from about 100 nm to about 5000 nm, from about 100 nm to about 4000 nm, from about 100 nm to about 3000 nm, from about 100 nm to about 2000 nm, from about 100 nm to about 1000 nm, from about 100 nm to about 500 nm or from about 10 nm to about 20 nm. Since the halide perovskite single crystal is formed to have a thickness of from about 1 nm to about 5000 nm, more specifically from about 5 nm to about 1000 nm, current characteristics may be improved. Thus, a difference in work function between the halide perovskite single crystal and the 2D semiconductor material layer can be reduced and the charge transport capability of the optoelectronic device can be improved.

In an embodiment of the present disclosure, the 2D semiconductor material layer and the halide perovskite single crystal may have a thickness ratio of from about $1:10^{-1}$ to about $1:10^7$. Specifically, the 2D semiconductor material layer and the halide perovskite single crystal may have a thickness ratio of from about $1:10^4$ to about $1:10^1$, from about $1:10^4$ to about $1:10^6$, from about $1:10^{-1}$ to about $1:10^5$, from about $1:10^{-1}$ to about $1:10^4$, from about $1:10^{-1}$ to about $1:10^3$, from about $1:10^{-1}$ to about $1:10^2$, from about $1:10^{-1}$ to about $1:10^1$, from about $1:1$ to about $1:10^7$, from about $1:1$ to about $1:10^6$, from about $1:1$ to about $1:10^5$, from about $1:1$ to about $1:10^4$, from about $1:1$ to about $1:10^3$, from about $1:1$ to about $1:10^2$, from about $1:1$ to about $1:10^1$, from about $1:10$ to about $1:10^7$, from about $1:10$ to about $1:10^6$, from about $1:10$ to about $1:10^5$, from about $1:10$ to about $1:10^4$, from about $1:10$ to about $1:10^3$, from about $1:10$ to about $1:10^2$, from about $1:10^2$ to about $1:10^2$, from about $1:10^2$ to about $1:10^6$, from about $1:10^2$ to about $1:10^5$, from about $1:10^2$ to about $1:10^4$ or from about $1:10^2$ to about $1:10^3$. As the thickness of the 2D semiconductor material layer is decreased, electrical transport characteristics can be improved, but the stability and light absorption characteristics of the finished device can be degraded. Therefore, it is important to set the optimal thickness. Even when the thickness of the halide perovskite single crystal is greatly increased, characteristics required to drive the optoelectronic device cannot be improved. Therefore, it is important to set the optimal thickness of the 2D semiconductor material layer and the optimal thickness of the halide perovskite single crystal. Also, it is important to appropriately set a thickness ratio between them. In an embodiment of the present disclosure, the optoelectronic device can be stably driven at a thickness ratio of from $1:10^{-1}$ to $1:10^7$. For optimal charge transport efficiency, it is desirable to set the thickness ratio in the range of from $1:10^2$ to $1:10^4$.

In an embodiment of the present disclosure, a difference in work function between the halide perovskite single crystal and the 2D semiconductor material layer may be about 5 eV or less, but may not be limited thereto. Specifically, a difference in work function between the halide perovskite single crystal and the 2D semiconductor material layer may be about 5 eV or less, about 4 eV or less, from about 3 eV or less, about 2 eV or less, about 1 eV or less, about 0.5 eV or less or about 0.3 eV or less. More specifically, in the optoelectronic device including the heterojunction of the halide perovskite single crystal and the 2D semiconductor material layer, the very thin 2D semiconductor material layer is not much different in work function than the halide perovskite single crystal, and, thus, charges can be freely moved, which may result in an improvement of electrical transport characteristics. When the thickness of the 2D semiconductor material layer is increased, an energy barrier formed by a difference in work function between the 2D semiconductor material layer and the halide perovskite single crystal causes degradation in electrical transport characteristics.

Figure 5A:
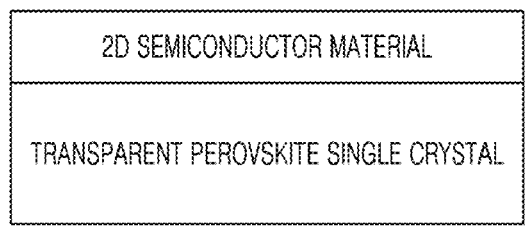
FIG. 5 schematically illustrates various structures of an optoelectronic device including a heterojunction in accordance with an embodiment of the present disclosure (FIGS. 5A, 5B and 5C).
Figure 5B:
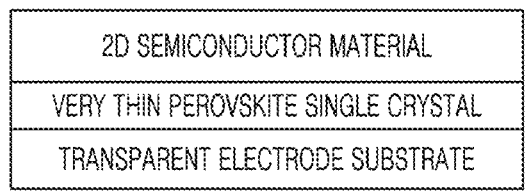
Figure 5C:
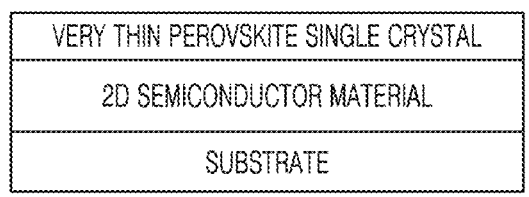

The optoelectronic device according to an embodiment of the present disclosure changes an energy structure by controlling semiconductor characteristics and work functions depending on the selected halide perovskite and 2D semiconductor material and thus controls electrical transport characteristics. Specifically, according to embodiments of the present disclosure, in the optoelectronic device, the 2D semiconductor material layer is formed thin and bonded to the halide perovskite single crystal. Thus, it is possible to reduce the scale of the optoelectronic device. A material of the halide perovskite single crystal and a material of the 2D semiconductor material layer can be selected depending on purpose, and, thus, the energy level can be adjusted. Therefore, it is easy to design a device as desired Referring to FIG. 5, the 2D semiconductor material layer and the halide perovskite single crystal in the heterojunction of the optoelectronic device according to the present disclosure may be present in various shapes. Specifically, the heterojunction may have a structure in which the 2D semiconductor material layer is formed on the halide perovskite single crystal. In this case, the thickness of each can be adjusted depending on purpose, and the thickness of the 2D semiconductor material layer may be smaller or greater than that of the halide perovskite single crystal (FIG. 5A). The heterojunction may have a structure in which the perovskite is formed on a substrate and the 2D semiconductor material layer is formed on the halide perovskite single crystal. In this case, the thickness of each can be adjusted depending on purpose, and the thickness of the 2D semiconductor material layer may be smaller or greater than that of the halide perovskite single crystal (FIG. 5B). The heterojunction may have an inverted structure in which the 2D semiconductor material layer is formed on a substrate and the halide perovskite single crystal is formed on the 2D semiconductor material layer. In this case, the thickness of each can be adjusted depending on purpose, and the thickness of the 2D semiconductor material layer may be smaller or greater than that of the halide perovskite single crystal (FIG. 5C).

In an embodiment of the present disclosure, the optoelectronic device may be a perovskite solar cell, but may not be limited thereto.

Figure 6:
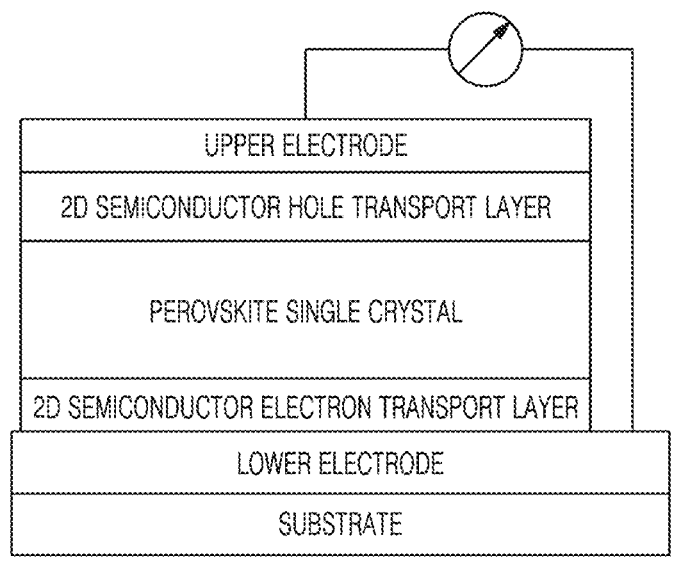
FIG. 6 is a schematic diagram illustrating a perovskite solar cell to which a heterojunction of a halide perovskite single crystal and a 2D semiconductor material layer is applied in accordance with an embodiment of the present disclosure.

Referring to FIG. 6, the perovskite solar cell includes: a lower electrode formed on a substrate; an electron transport layer formed on the lower electrode; a halide perovskite single crystal formed on the electron transport layer; a hole transport layer formed on the halide perovskite single crystal; and an upper electrode formed on the hole transport layer. Any one or both of the electron transport layer and the hole transport layer may include the 2D semiconductor material layer, but may not be limited thereto.

In an embodiment of the present disclosure, the 2D semiconductor material may include $MoS_2$, $MoSe_2$, $WSe_2$, $ReS_2$, $ReSe_2$, $MoTe_2$, $WS_2$, $WTe_2$, $HfS_2$, $HfSe_2$, $HfTe_2$, $ZrS_2$, $ZrSe_2$, $ZrTe_2$, InSe, $In_2Se_3$ or black phosphorus, but may not be limited thereto.

In an embodiment of the present disclosure, the 2D semiconductor material layer may be used as any one or both of the electron transport layer and the hole transport layer. Specially, if an N-type semiconductor is used as the 2D semiconductor material layer, it may serve as the electron transport layer, or if a P-type semiconductor is used as the 2D semiconductor material layer, it may serve as the hole transport layer. The N-type semiconductor may include $MoS_2$, $WS_2$, $WSe_2$, $ReS_2$, $ReSe_2$ or $MoTe_2$, and the P-type semiconductor may include $WSe_2$ or $MoSe_2$.

In an embodiment of the present disclosure, the electron transport layer may include the 2D semiconductor material layer, and the hole transport layer may include one or more members selected from Spiro-OMeTAD [2,2',7,7'-tetrakis-(N,N-di-memethoxyphenylamino)-9,9'-spirobifluorene], PEDOT:PSS [poly(3,4-ethylenedioxythiophene):poly(4-styrene sulfonate)], G-PEDOT [poly(3,4-ethylenedioxythiophene):poly(4-styrene sulfonate):polyglycol(glycerol)], PANI:PSS [polyaniline:poly(4-styrene sulfonate)], PANI:CSA (polyaniline:camphor sulfonic acid), PDBT [poly(4,4'-dimethoxy bithophene)], poly(3-hexylthiophene) (P3HT), poly[2,1,3-benzothiadiazole-4,7-diyl[4,4'-bis(2-ethyl-hexyl)-4H-cyclopenta[2,1-b:3,4-b']dithiophene-2,6-diyl]] (PCPDTBT), Poly[[9-(1-octylnonyl)-9H-carbazole-2,7-diyl]-2,5-thiophenedlyl-2,1,3-benzothiadiazole-4,7-diyl-2,5-thiophenedlyl] (PCDTBT), poly(triarylamine) (PTAA), $MoO_3$, $V_2O_5$, NiO, $WO_3$, CuI and CuSCN, but may not be limited thereto.

In an embodiment of the present disclosure, the 2D semiconductor material layer may be used only as the electron transport layer. Specifically, if the 2D semiconductor material layer is used only as the electron transport layer, $TiO_2$ or $SnO_2$ may be used as the 2D semiconductor material. In this case, the hole transport layer may be Spiro-OMeTAD or PEDOT:PSS.

In an embodiment of the present disclosure, the 2D semiconductor material layer may be used only as the hole transport layer. Specifically, the hole transport layer may include the 2D semiconductor material layer and the electron transport layer may include $TiO_2$ or $SnO_2$, but may not be limited thereto.

In an embodiment of the present disclosure, the substrate may be flexible, transparent or flexible and transparent, but may not be limited thereto. Specifically, the substrate may include a metal, a metal oxide, a polymer (PET or the like), or glass, but may not be limited thereto. For example, the substrate may be a substrate including single crystals of $SrTiO_3$, GaN, or the like, but may not be limited thereto.

In an embodiment of the present disclosure, the lower electrode may include a metal or a conductive oxide and may be a transparent or opaque electrode, but may not be limited thereto. Specifically, the metal may include Fe, Mn, Ni, V, Co, Ti, Mg, Ca, Cu, Nb, or Zr, but may not be limited thereto. For example, the conductive oxide may include $SrRuO_3$, $(La,Sr)CoO_3$, ITO, FTO, ruthenium oxide (for example, $RuO_2$ or the like), nickel oxide (for example, NiO or the like), iridium oxide (for example, $IrO_2$ or the like), tin oxide (for example, $SnO_2$ or the like), indium oxide (for example, $In_2O_3$ or the like), or vanadium oxide (for example, $V_2O_5$ or the like), but may not be limited thereto.

In an embodiment of the present disclosure, if the transparent electrode is used, absorption of light can be increased. Specifically, the transparent electrode may be a multi-layer thin film including AZO (Al-doped ZnO), $TiO_2$ (titanium dioxide), GZO (Ga-doped ZnO), ITO (indium tin oxide), FTO (fluorine-doped tin oxide), indium oxide (for example, $In_2O_3$ or the like) or an oxide-metal-oxide structure, but may not be limited thereto. A glass substrate may be used as a substrate for the transparent electrode.

In an embodiment of the present disclosure, the upper electrode may include a metal such as Pt, Au, Ag, Pd, Al, Co and the like, or a 2D metal such as graphene, but may not be limited thereto.

According to a second aspect of the present disclosure, there is provided a method of manufacturing an optoelectronic device, including positioning a 2D semiconductor material layer on a flexible polymer film, adjusting the positions of the 2D semiconductor material layer and a halide perovskite single crystal by moving the flexible polymer film, and removing the flexible polymer film and bonding the 2D semiconductor material layer to the halide perovskite single crystal.

Detailed descriptions of the second aspect of the present disclosure, which overlap with those of the first aspect of the present disclosure, are omitted hereinafter, but the descriptions of the first aspect of the present disclosure may be identically applied to the second aspect of the present disclosure, even though they are omitted hereinafter.

In an embodiment of the present disclosure, the flexible polymer film may be removed by slowly picking up and peeling off the flexible polymer film with a tweezer. The flexible polymer film is in the form of a flexible thin film, and, thus, if it is slowly picked up with a tweezer, it can be thoroughly removed without leaving foreign substances on the perovskite single crystal.

In an embodiment of the present disclosure, the flexible polymer film may include a PDMS, but may not be limited thereto.

In an embodiment of the present disclosure, the positioning of the 2D semiconductor material layer on the flexible polymer film may be performed by positioning a tape on which the 2D semiconductor material layer has been formed on the flexible polymer film and removing the tape. Specifically, the tape may be a blue tape that is used for mechanical exfoliation. By bonding the tape on which the 2D semiconductor material layer has been formed to the flexible polymer film, the tape can be positioned on the flexible polymer film.

In an embodiment of the present disclosure, the 2D semiconductor material layer may be prepared by mechanical exfoliation and chemical vapor deposition, but may not be limited thereto.

Figure 7:
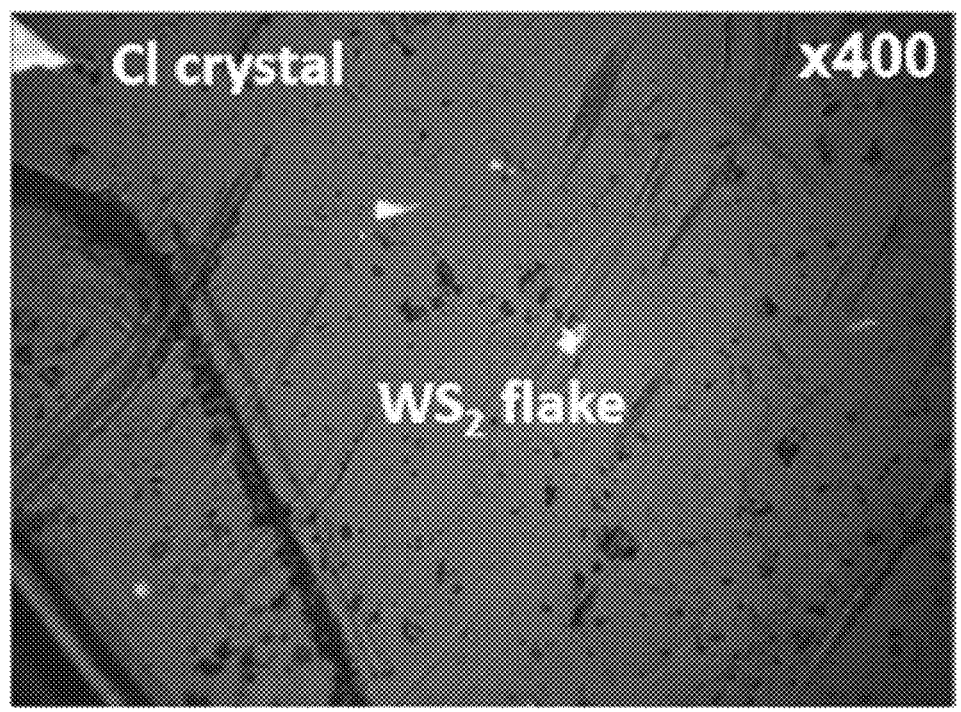
FIG. 7 is a photograph showing a 2D semiconductor material layer transferred onto a halide perovskite single crystal using a PDMA film in accordance with an example of the present disclosure.
Figure 8:
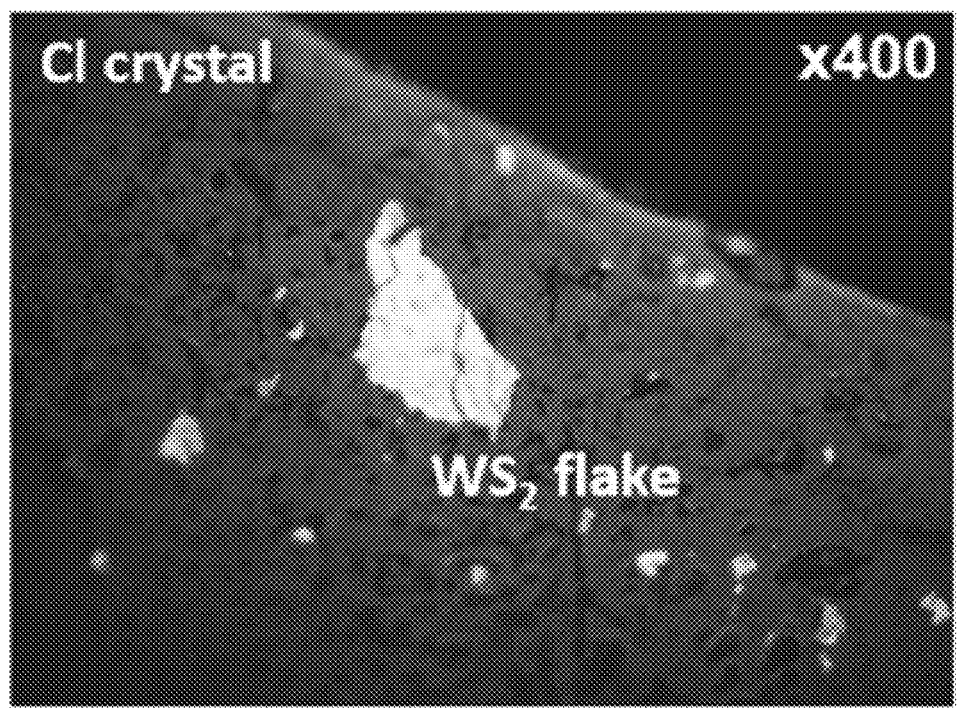
FIG. 8 is a photograph showing a 2D semiconductor material layer transferred onto a halide perovskite single crystal using a thermal release tape in accordance with a comparative example of the present disclosure.

According to embodiments of the present disclosure, the optoelectronic device is manufactured by bonding the 2D semiconductor material layer to the halide perovskite single crystal through low-temperature dry transfer printing. Therefore, it is possible to suppress damage to the surface of the halide perovskite single crystal. Also, it is possible to transfer a semiconductor material having a thin 2D structure to the halide perovskite single crystal. Accordingly, it is possible to increase the adhesion between the perovskite single crystal and the 2D semiconductor material layer. Specifically, according to the conventional technology, a 2D semiconductor material layer can be transferred onto perovskite using a thermal release tape, but the thermal release tape is thick and inflexible, and, thus, it is impossible to transfer the 2D semiconductor material layer as a thin layer. However, according to an embodiment of the present disclosure, the 2D semiconductor material layer is formed on the perovskite single crystal using the highly flexible polymer film, and, thus, adhesion to the perovskite material can be increased and the 2D semiconductor material layer can be formed as a thin layer. Also, according to the conventional technology, the thermal release tape is removed by applying heat, and, thus, residues may remain on the perovskite. However, if the flexible polymer film is used, weak adhesion of the flexible polymer film itself is used, and, thus, it is possible to transfer the 2D semiconductor material layer with less residues on the surface (FIG. 7 and FIG. 8).

Hereafter, the present disclosure will be explained in more detail with reference to Examples. However, the following Examples are illustrative only for better understanding of the present disclosure but do not limit the present disclosure.

EXAMPLES

1. Example: Manufacture of Optoelectronic Device Including Heterojunction of Halide Perovskite Single Crystal ($CH_3NH_3PbCl_3$) and 2D Semiconductor Material Layer ($WS_2$)

Example 1-1. Preparation Example 1 of Halide Perovskite Single Crystal ($CH_3NH_3PbBr_3$ and $CH_3NH_3PbI_3$ Single Crystals)

Figure 9:
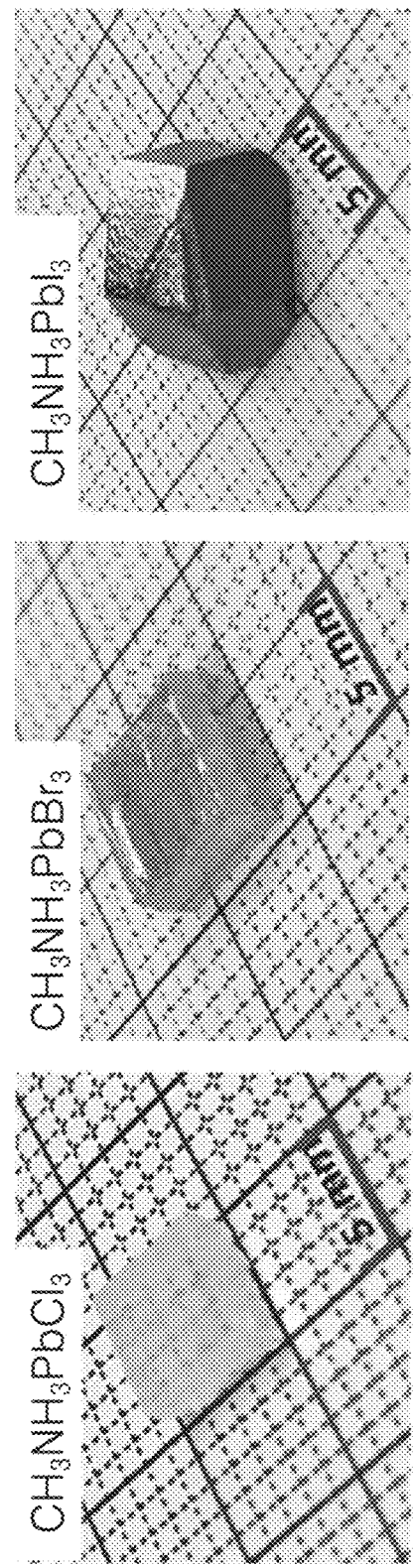
FIG. 9 provides photographs each showing a transparent perovskite device manufactured by growing a halide perovskite single crystal on a transparent substrate in accordance with an example of the present disclosure.
Figure 10:
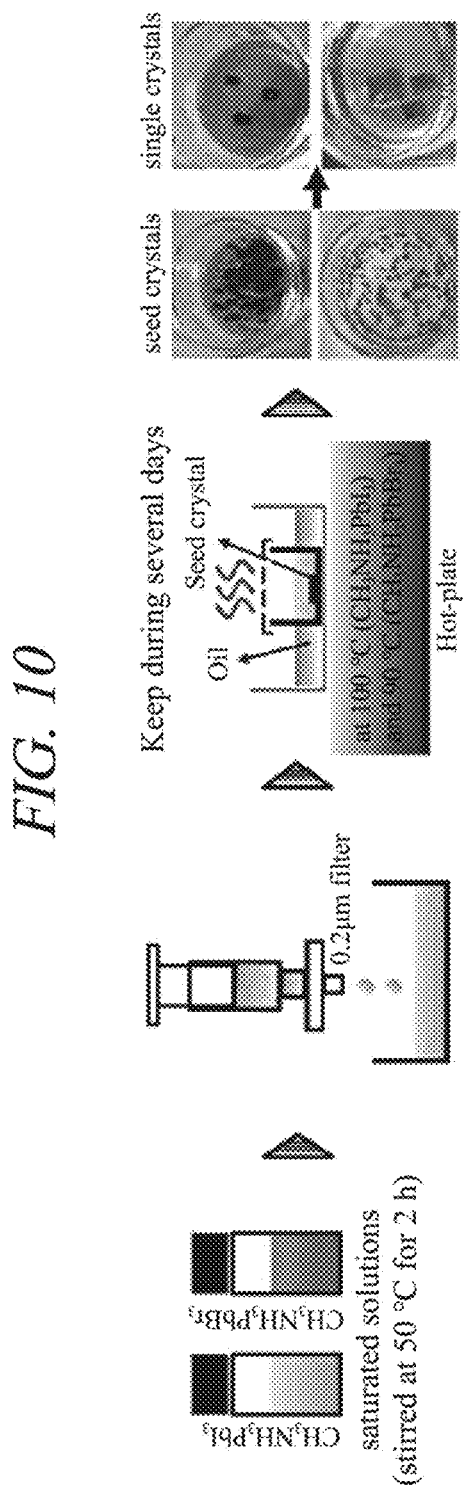
FIG. 10 schematically illustrates a manufacturing process of halide perovskite ($CH_3NH_3PbBr_3$, $CH_3NH_3PbI_3$) single crystals in accordance with an example of the present disclosure.

A halide perovskite precursor solution for each of $CH_3NH_3PbBr_3$ and $CH_3NH_3PbI_3$ was prepared and filtered. In Examples, a 0.2 mm filter was used for filtration. The filtered solution was placed for a predetermined period of time in an oil bath on a hot plate maintained at a predetermined temperature to grow mother crystals. The grown mother crystals were separated and immersed in a solution, which was prepared to be identical to the first used precursor solution, to grow large-size single crystals to be used as a substrate of a heterostructure (FIG. 9). The size of the single crystal substrate can be regulated by regulating the time of immersing the mother crystals in the precursor solution. Also, the solvent, temperature, time and filter size may be changed depending or: the preparation conditions of the halide perovskite material and the precursor solution used for single crystal growth, and some processes may be omitted (FIG. 10).

Example 1-2. Preparation Example 2 of Halide Perovskite Single Crystal ($CH_3NH_3PbCl_3$ Single Crystal)

Figure 11:
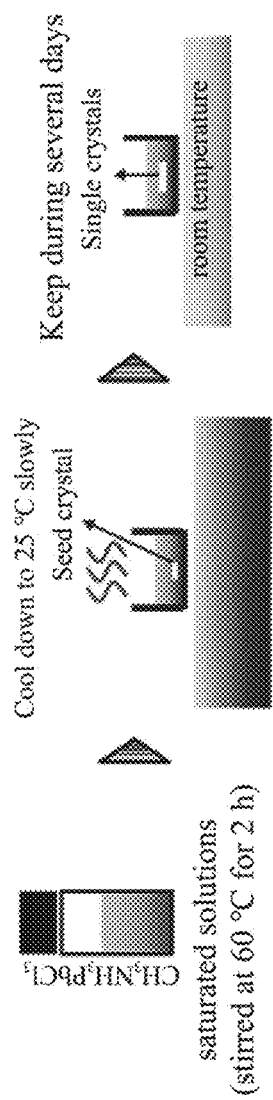
FIG. 11 schematically illustrates a manufacturing process of halide perovskite ($CH_3NH_3PbCl_3$) single crystals in accordance with an example of the present disclosure.

A halide perovskite precursor solution for $CH_3NH_3PbCl_3$ was prepared and then slowly cooled to 25° C. or room temperature. The cooling rate can be regulated. The cooled precursor solution was maintained without temperature changes and used to form very thin perovskite single crystals (FIG. 9). The size of a single crystal substrate can be regulated by regulating the time of immersing the produced single crystals in the precursor solution. Also, the solvent, temperature, time and filter size may be changed depending on the preparation conditions of the halide perovskite material and the precursor solution used for single crystal growth (FIG. 11).

Example 1-3. Preparation Example 3 of Halide Perovskite Single Crystal ($CH_3NH_3PbCl_3$ Single Crystal)

Figure 12:
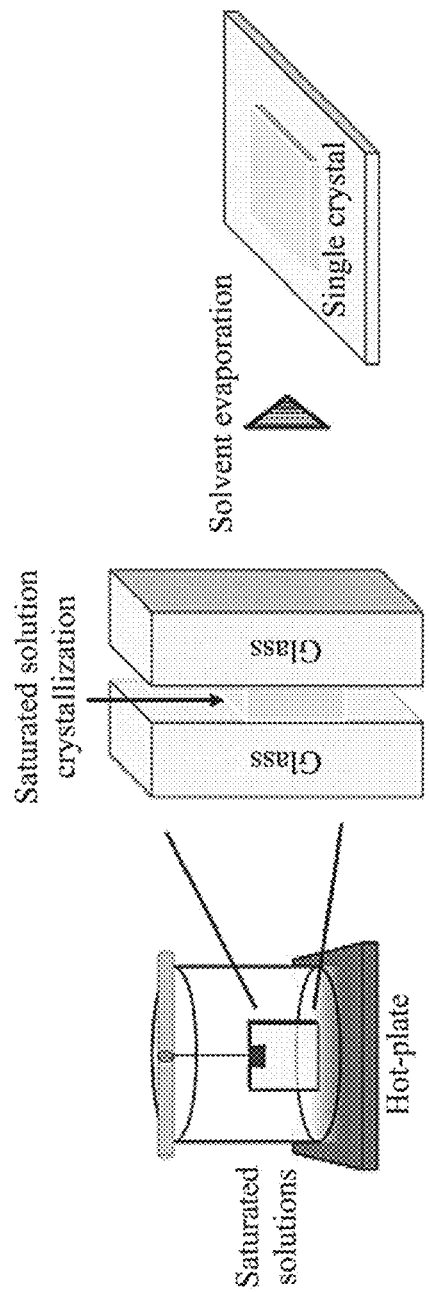
FIG. 12 schematically illustrates a manufacturing process of halide perovskite ($H_3NH_3PbCl_3$) single crystals in accordance with an example of the present disclosure.

Example 1-3 is a method for growing thin single crystals directly on a substrate. First, a halide perovskite precursor solution was prepared and two substrates were closely bonded to each other. Then, a part of the bonded substrates was immersed in the precursor solution to position the precursor solution between the substrates by means of capillarity. Then, the solution was maintained at a temperature of 90° C. or 100° C. to evaporate solvent, and, thus, very thin perovskite single crystals were formed on the substrate (FIG. 9). The size of a e crystal substrate can be regulated by regulating the time of immersion in the precursor solution. Also, the solvent, solution concentration, temperature and time may be changed depending on the preparation conditions of the substrate, the halide perovskite material and the precursor solution used for single crystal growth of Example 1-3 (FIG. 12).

Example 2-1. Preparation Example 1 of Heterojunction of Halide Perovskite Single Crystal-2D Semiconductor Material Layer (Example 1)

As shown in FIG. 1, a 2D semiconductor material was bonded to the halide perovskite single crystal prepared in Example 1 through dry transfer printing to form a heterojunction. In the dry transfer printing, the 2D semiconductor material prepared by mechanical exfoliation and chemical vapor deposition was bonded to a transparent PDMS film and the positions of the 2D material and perovskite single crystals on the PDMS film were examined with an optical microscope and adjusted to form a heterojunction at a desired position (FIG. 5A and FIG. 5B). In this preparation process, an additional solvent was not used to minimize damage to the surfaces of the halide perovskite single crystals.

Example 2-2. Preparation Example 2 of Heterojunction of Halide Perovskite Single Crystal-2D Semiconductor Material Layer (Example 2)

A 2D semiconductor material was deposited on a substrate by chemical vapor deposition and halide perovskite single crystals were grown on the 2D semiconductor material to prepare a heterojunction having an inverted structure (FIG. 5C). In this case, the substrates on which the 2D semiconductor material had been deposited by single crystal growth of Example 1-3 were closely bonded to each other to grow very thin perovskite single crystals on the 2D semiconductor material. Thus, a heterojunction having an inverted structure was prepared.

2. Test Example 1: Measurement of Charge Transport Characteristics of Optoelectronic Device Including Heterojunction of Halide Perovskite Single Crystal ($CH_3NH_3PbCl_3$) and 2D Semiconductor Material Layer ($WS_2$)

In an optoelectronic device including the heterojunction prepared in Example 1, charge transport characteristics depending on the thickness of a 2D semiconductor material layer ($WS_2$) were measured by KPFM.

Figure 13:
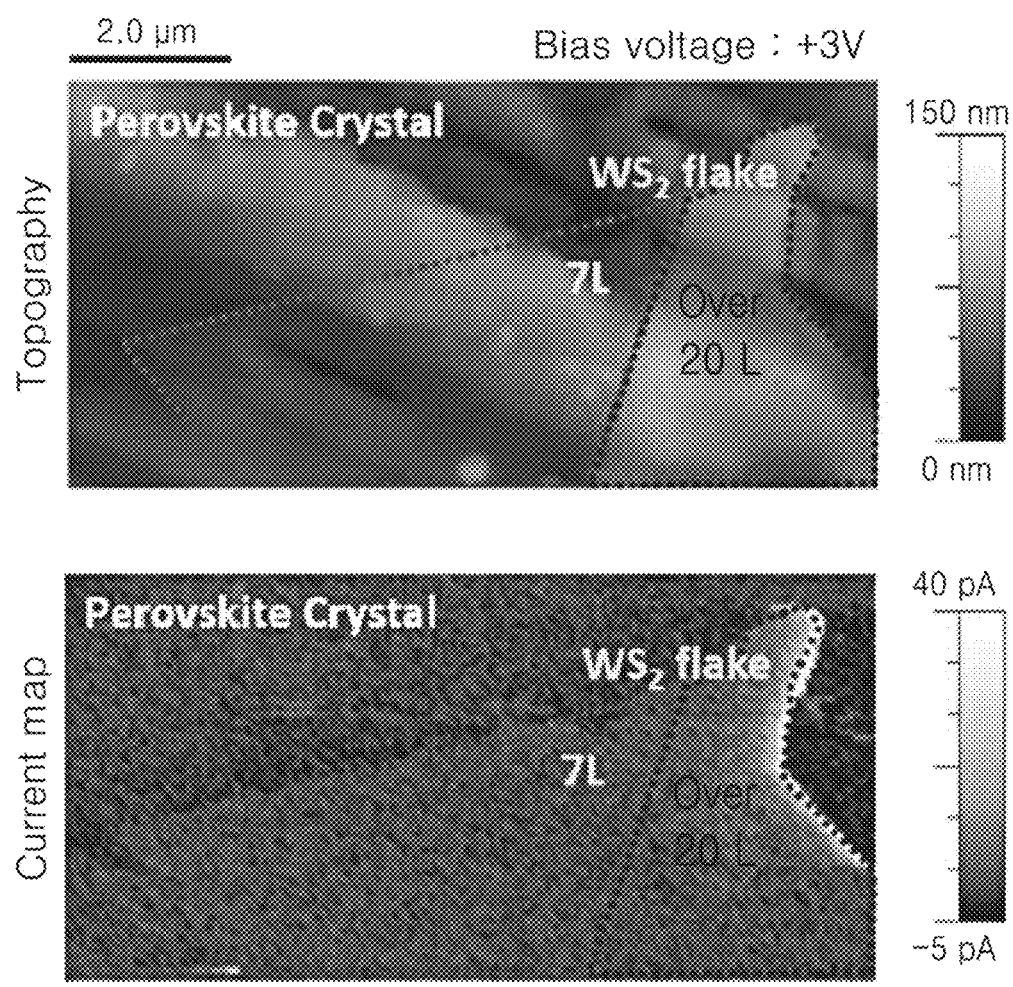
FIG. 13 provides photographs each showing a heterojunction of a halide perovskite single crystal and a 2D semiconductor material layer in accordance with an example of the present disclosure.
Figure 14:
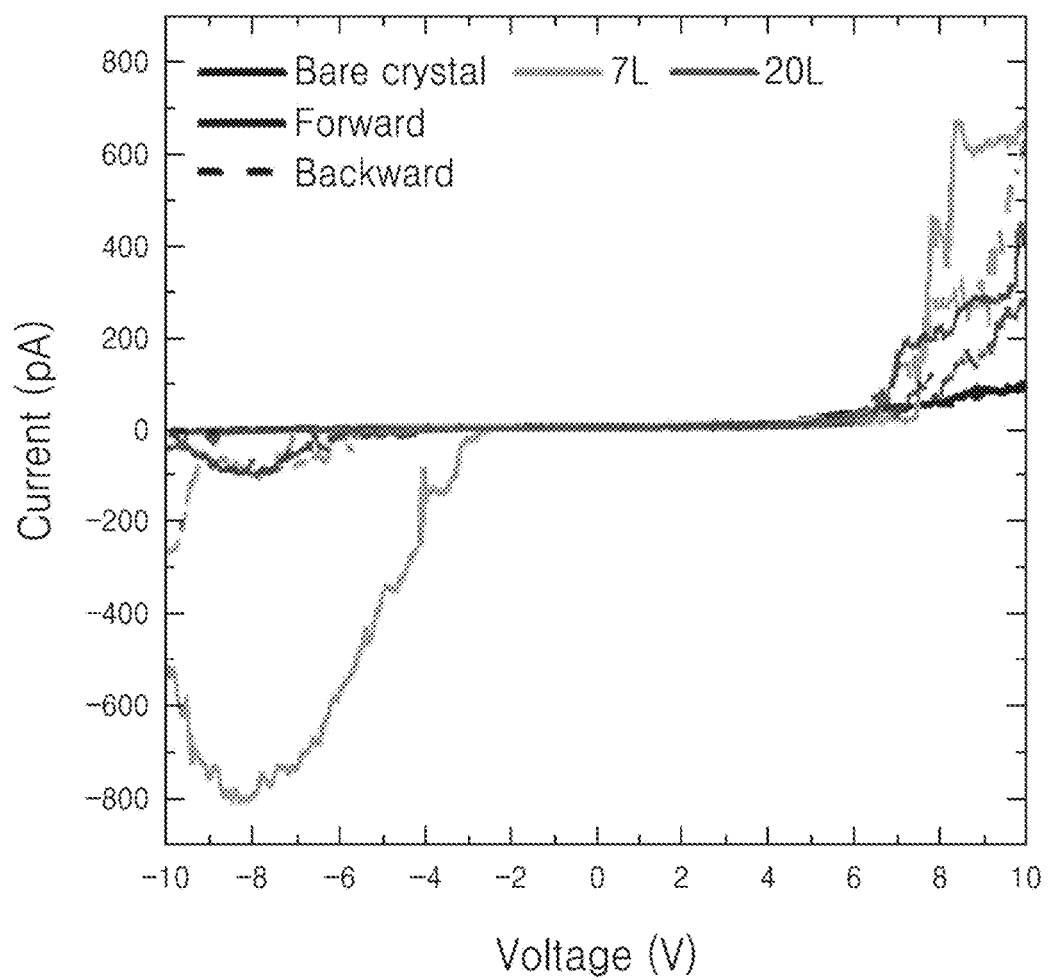
FIG. 14 is a graph showing data obtained from charge transport tests of a heterojunction of a halide perovskite single crystal and a 2D semiconductor material layer in accordance with an example of the present disclosure.
Figure 15:
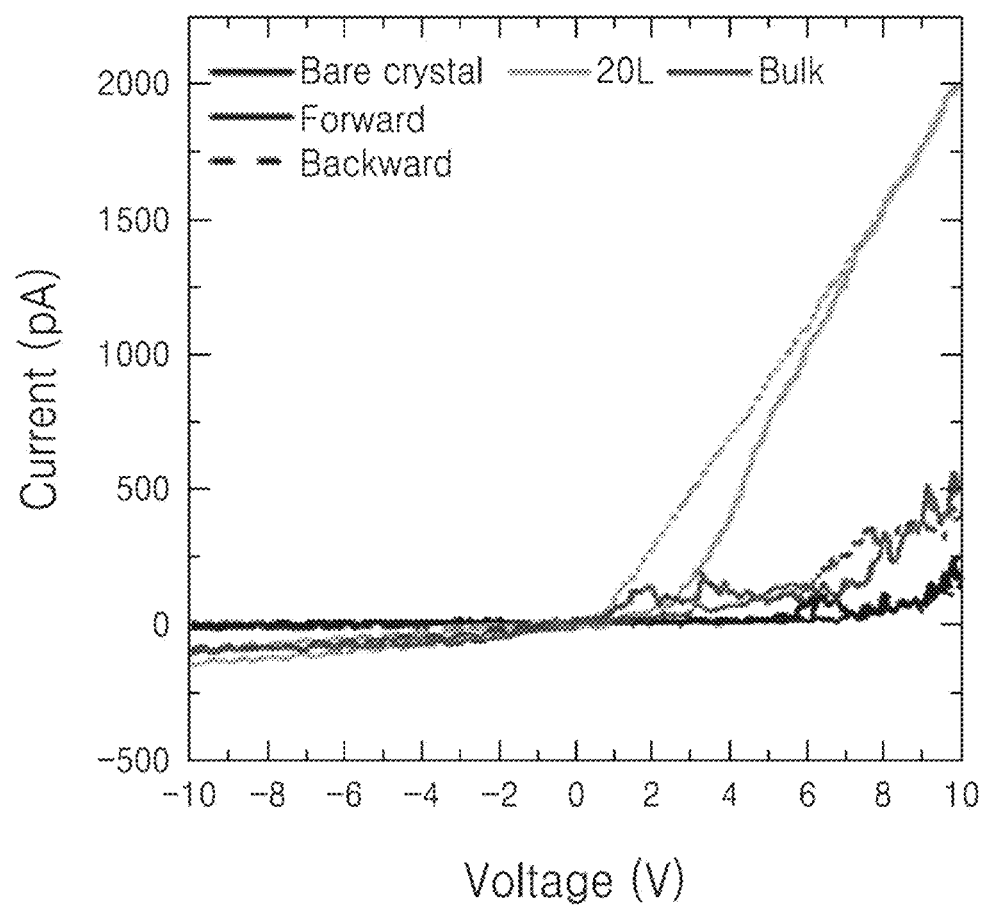
FIG. 15 is a graph showing data obtained from charge transport tests of a heterojunction of a halide perovskite single crystal and a 2D semiconductor material layer in accordance with an example of the present disclosure.

As a result of the test, when the 2D semiconductor material layer ($WS_2$) had a small thickness, current transport characteristics were greatly improved. However, when the 2D semiconductor material layer was formed thick, charge transport characteristics were improved, compared to the halide perovskite substrate alone, but charge transport characteristics were degraded, compared to the halide perovskite substrate to which the thin 2D semiconductor material layer had been bonded (FIG. 13 to FIG. 15).

3. Test Example 2: Measurement of Change in Energy Structure of Optoelectronic Device Including Heterojunction of Halide Perovskite Single Crystal ($CH_3NH_3PbCl_3$) and 2D Semiconductor Material Layer ($WS_2$)

Figure 16:
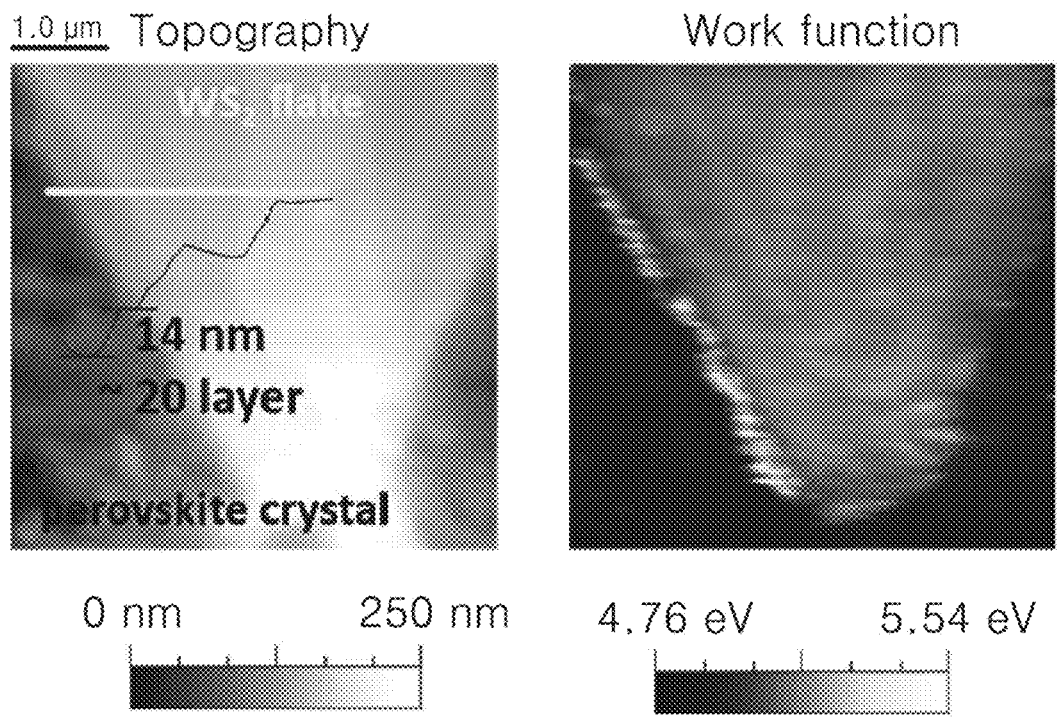
FIG. 16 provides photographs each showing the topography and work function of a heterojunction of a halide perovskite single crystal and a 2D semiconductor material layer in accordance with an example of the present disclosure.
Figure 17:
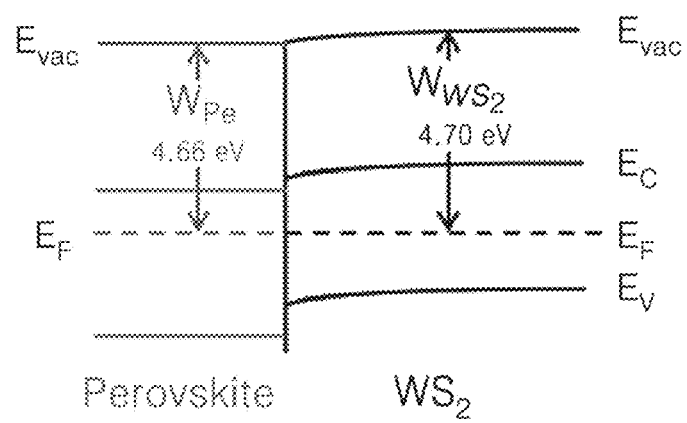
FIG. 17 is a graph showing a difference in work function between a halide perovskite single crystal and a 2D semiconductor material layer (seven (7) layers) of a heterojunction in accordance with an example of the present disclosure.
Figure 18:
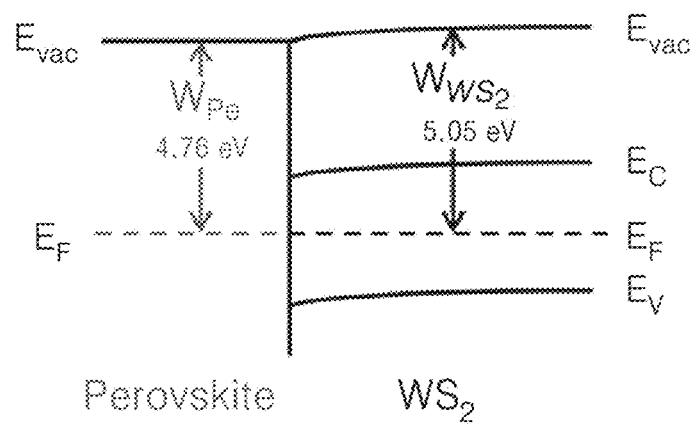
FIG. 18 is a graph showing a difference in work function between a halide perovskite single crystal and a 2D semiconductor material layer (twenty (20) layers) of a heterojunction in accordance with an example of the present disclosure.
Figure 19:
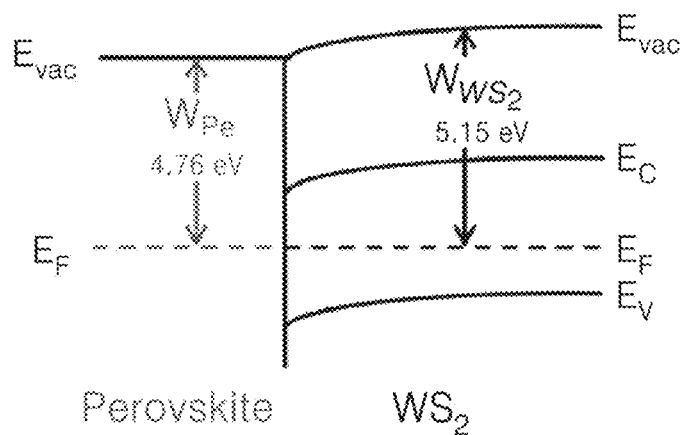
FIG. 19 is a graph showing a difference in work function between a halide perovskite single crystal and a 2D semiconductor material layer (fifty (50) layers) of a heterojunction in accordance with a comparative example of the present disclosure.

In an optoelectronic device including the heterojunction prepared in Example 1, changes in energy structure depending on the thickness of a 2D semiconductor material layer were measured by KPFM (FIG. 16).

As a result of the test, in the optoelectronic device including a heterojunction of a seven (7)-layered 2D semiconductor material layer having a thickness of 5.5 nm and a halide perovskite single crystal, a significant difference in work function between the halide perovskite single crystal substrate and the 2D semiconductor material layer was not observed, and a difference in work function was maintained at less than 2 eV until a twenty (20)-layered 2D semiconductor material layer having a thickness of 14 nm was bonded, which confirmed excellent charge transport capability. However, when the thickness of the 2D semiconductor material layer was more than 14 nm corresponding to 20 layers, the work function sharply increased. In a comparative example, when a 2D semiconductor material layer was formed to a thickness of 35 nm corresponding to 50 layers, a significant difference in energy barrier height was made, which confirmed a remarkable degradation in the charge transport capability (FIG. 16 to FIG. 19).

The above description of the present disclosure is provided for the purpose of illustration, and it would be understood by a person with ordinary skill in the art that various changes and modifications may be made without changing technical conception and essential features of the present disclosure. Thus, it is clear that the above-described examples are illustrative in all aspects and do not limit the present disclosure. For example, each component described to be of a single type can be implemented in a distributed manner. Likewise, components described to be distributed can be implemented in a combined manner.

The scope of the present disclosure is defined by the following claims rather than by the detailed description of the embodiment. It shall be understood that all modifications and embodiments conceived from the meaning and scope of the claims and their equivalents are included in the scope of the present disclosure.

We claim:

1. An optoelectronic device, comprising:
   a heterojunction of a halide perovskite single crystal and a 2D semiconductor material layer;
   wherein a difference in work function between the halide perovskite single crystal and the 2D semiconductor material layer is 0.3 eV or less;
   wherein a high carrier mobility in the 2D semiconductor material layer induces hole-electron separation of a carrier in the halide perovskite single crystal;
   wherein the 2D semiconductor material layer has a thickness of 5 nm to 15 nm;
   wherein the 2D semiconductor material layer is an electron transport layer; and
   wherein the 2D semiconductor material includes $WSe_2$, $ReS_2$, $ReSe_2$, $MoTe_2$, $WS_2$.

2. The optoelectronic device according to claim 1, wherein the halide perovskite single crystal has a thickness of from 1 nm to 5000 nm.

3. The optoelectronic device according to claim 1, wherein the 2D semiconductor material layer and the halide perovskite single crystal have a thickness ratio of from $1:10^{-1}$ to $1:10^{7}$.

4. The optoelectronic device according to claim 1, wherein the optoelectronic device is a perovskite solar cell.

5. The optoelectronic device according to claim 4, wherein the perovskite solar cell includes:
   a lower electrode formed on a substrate;
   the electron transport layer formed on the lower electrode;
   the halide perovskite single crystal formed on the electron transport layer;
   a hole transport layer formed on the halide perovskite single crystal; and
   an upper electrode formed on the hole transport layer,
   wherein the electron transport layer includes the 2D semiconductor material layer.

6. The optoelectronic device according to claim 5, wherein the hole transport layer includes one or more members selected from Spiro-OMeTAD [2,2',7,7'-tetrakis-(N-di-4-methoxyphenylamino)-9,9'-spirobifluorene], PEDOT:PSS [poly(3,4-ethylenedioxythiophene):poly(4-styrene sulfonate)] G-PEDOT [poly(3,4-ethylenedioxythiophene):poly(4-styrene sulfonate):polyglycol(glycerol)], PANI:PSS [polyaniline:poly(4-styrene sulfonate)], PANI:CSA (polyaniline:camphor sulfonic acid), PDBT [poly(4,4'-dimethoxy bithophene)], poly(3-hexylthiophene) (P3HT), poly[2,1,3-benzothiadiazole-4,7-diyl[4,4-bis(2-ethylhexyl)-4H-cyclopenta[2,1-b:3,4-b']dithiophene-2,6-diy]] (PCPDTBT), Poly[[9-(1-octylnonyl)-9H-carbazole-2,7-diyl]-2,5-thiophenediyl-2,1,3-benzothiadiazole-4,7-diyl-2,5-thiophenediyl] (PCDTBT), poly(triarylamine) (PTAA), $MoO_3$, $V_2O_5$, NiO, $WO_3$, CuI and CuSCN.

7. A method of manufacturing an optoelectronic device, comprising:
   positioning a 2D semiconductor material layer on a flexible polymer film;
   adjusting the positions of the 2D semiconductor material layer and a halide perovskite single crystal by moving the flexible polymer film; and
   removing the flexible polymer film and bonding the 2D semiconductor material layer to the halide perovskite single crystal;
   wherein a difference in work function between the halide perovskite single crystal and the 2D semiconductor material layer is 0.3 eV or less;
   wherein a high carrier mobility in the 2D semiconductor material layer induces hole-electron separation of a carrier in the halide perovskite single crystal;
   wherein the 2D semiconductor material layer has a thickness of 5 nm to 15 nm;
   wherein the 2D semiconductor material layer is an electron transport layer; and
   wherein the 2D semiconductor material includes $WSe_2$, $ReS_2$, $ReSe_2$, $MoTe_2$, $WS_2$.

8. The method of claim 7,
   wherein the positioning of the 2D semiconductor material layer on the flexible polymer film is performed by positioning a tape on which the 2D semiconductor material layer has been formed on the flexible polymer film and removing the tape.

9. A perovskite solar cell comprising:
   a lower electrode formed on a substrate;
   an electron transport layer formed on the lower electrode;
   a halide perovskite single crystal formed on the electron transport layer;

a hole transport layer formed on the halide perovskite single crystal; and an upper electrode formed on the hole transport layer,
wherein the hole transport layer includes a 2D semiconductor material layer,
wherein a difference in work function between the halide perovskite single crystal and the 2D semiconductor material layer is 0.3 eV or less;
wherein a high carrier mobility in the 2D semiconductor material layer induces hole-electron separation of a carrier in the halide perovskite single crystal;
wherein the 2D semiconductor material layer has a thickness of 5 nm to 15 nm;
wherein the electron transport layer is a second 2D semiconductor material layer; and
wherein the 2D semiconductor material includes $WSe_2$, $ReS_2$, $ReSe_2$, $MoTe_2$, $WS_2$.

10. The perovskite solar cell according to claim 9, wherein the electron transport layer includes another 2D semiconductor material layer.

11. The perovskite solar cell according to claim 10,
wherein the hole transport layer includes one or more members selected from Spiro-OMeTAD [2,2',7,7'-tetrakis-(N-di-4-methoxyphenylamino)-9,9'-spirobifluorene], PEDOT:P55 [poly(3,4-ethylenedioxythiophene):poly(4-styrene sulfonate)] G-PEDOT [poly(3,4-ethylenedioxythiophene):poly(4-styrene sulfonate):polyglycol(glycerol)], PANI:PSS [polyaniline:poly(4-styrene sulfonate)], PANI:CSA (polyaniline:camphor sulfonic acid), PDBT [poly(4,4'-dimethoxy bithophene)], poly(3-hexylthiophene) (P3HT), poly[2,1,3-benzothiadiazole-4,7-diyl[4,4-bis(2-ethylhexyl)-4H-cyclopenta[2,1-b:3,4-b']dithiophene-2,6-diyl]] (PCPDTBT), Poly[[9-(1-octylnonyl)-9H-carbazole-2,7-diyl]-2,5-thiophenediyl-2,1,3-benzothiadiazole-4,7-diyl-2,5-thiophenediyl] (PCDTBT), poly(triarylamine) (PTAA), $MoO_3$, $V_2O_5$, NiO, $WO_3$, CuI and CuSCN.

* * * * *

UNITED STATES PATENT AND TRADEMARK OFFICE
CERTIFICATE OF CORRECTION

| | | |
|---|---|---|
| PATENT NO. | : 11,997,857 B2 | Page 1 of 1 |
| APPLICATION NO. | : 16/913502 | |
| DATED | : May 28, 2024 | |
| INVENTOR(S) | : William Jo and Hye Ri Jung | |

It is certified that error appears in the above-identified patent and that said Letters Patent is hereby corrected as shown below:

On the Title Page

Item (73) Column 1, please delete "Fo," and insert --Foundation,--

Signed and Sealed this
Seventeenth Day of September, 2024

Katherine Kelly Vidal
*Director of the United States Patent and Trademark Office*